(12) United States Patent
Long

(10) Patent No.: US 11,502,112 B2
(45) Date of Patent: Nov. 15, 2022

(54) ELECTRO-STATIC DISCHARGE PROTECTION CIRCUIT, DISPLAY PANEL AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 168 days.

(21) Appl. No.: 16/638,549

(22) PCT Filed: Jul. 23, 2019

(86) PCT No.: PCT/CN2019/097230
§ 371 (c)(1),
(2) Date: Feb. 12, 2020

(87) PCT Pub. No.: WO2020/042834
PCT Pub. Date: Mar. 5, 2020

(65) Prior Publication Data
US 2021/0074732 A1    Mar. 11, 2021

(30) Foreign Application Priority Data

Aug. 30, 2018    (CN) .......................... 201821413041.3

(51) Int. Cl.
*H01L 27/12* (2006.01)
*H01L 27/02* (2006.01)
(Continued)

(52) U.S. Cl.
CPC ...... *H01L 27/124* (2013.01); *G02F 1/136286* (2013.01); *H01L 27/0248* (2013.01); *G09G 3/20* (2013.01); *G09G 2330/04* (2013.01)

(58) Field of Classification Search
CPC ............... H01L 27/124; H01L 27/0248; H01L 29/7869; G02F 1/136286
See application file for complete search history.

(56) References Cited

U.S. PATENT DOCUMENTS 6,043,971 A    3/2000  Song et al.
8,085,352 B2   12/2011 Kim et al.
(Continued)

FOREIGN PATENT DOCUMENTS

CN    101419967 A    4/2009
CN    103943611 A    7/2014
(Continued)

OTHER PUBLICATIONS

The International Search Report and Written Opinion, for International Application No. PCT/CN2019/097230, dated Oct. 21, 2019, 16 pages.
(Continued)

*Primary Examiner* — Peter M Albrecht
(74) *Attorney, Agent, or Firm* — Westman, Champlin & Koehler, P.A.

(57) ABSTRACT

An ESD protection circuit including a TFT arranged between a to-be-protected signal line and a discharging line is provided, wherein a length direction of a channel of the TFT is parallel to an extension direction of the to-be-protected signal line. A display panel and a display device are also provided.

9 Claims, 5 Drawing Sheets

(51) Int. Cl.
    *G02F 1/1362*     (2006.01)
    *G09G 3/20*     (2006.01)

(56) References Cited

U.S. PATENT DOCUMENTS

| | | |
|---|---|---|
| 9,220,161 B2 | 12/2015 | Zheng |
| 9,939,696 B2 | 4/2018 | Nakanishi et al. |
| 2008/0135846 A1 | 6/2008 | Shin et al. |
| 2009/0102995 A1 | 4/2009 | Kim et al. |
| 2011/0240935 A1* | 10/2011 | Yano .................. C04B 35/6261 |
| | | 252/519.51 |
| 2014/0240889 A1 | 8/2014 | Zheng |
| 2015/0187750 A1 | 7/2015 | Kim et al. |
| 2017/0038650 A1 | 2/2017 | Nakanishi et al. |
| 2018/0033806 A1* | 2/2018 | Long .................. H01L 27/1244 |
| 2020/0194425 A1 | 6/2020 | Long |

FOREIGN PATENT DOCUMENTS

| | | | | |
|---|---|---|---|---|
| CN | 105487317 A | * | 4/2016 | ........... H01L 27/124 |
| CN | 205810810 U | | 12/2016 | |
| CN | 106662783 A | | 5/2017 | |
| CN | 208507683 U | | 2/2019 | |
| CN | 208622722 U | | 3/2019 | |

OTHER PUBLICATIONS

Extended European Search Report, for European Patent Application No. 19853266.5, dated May 3, 2022, 8 pages.

* cited by examiner

ELECTRO-STATIC DISCHARGE PROTECTION CIRCUIT, DISPLAY PANEL AND DISPLAY DEVICE

CROSS-REFERENCE TO RELATED APPLICATION

This application is the U.S. national phase of PCT Application No. PCT/CN2019/097230 filed on Jul. 23, 2019, which claims priority to Chinese Patent Application No. 201821413041.3 filed in China on Aug. 30, 2018, the disclosures of which are incorporated herein in their entireties by reference.

TECHNICAL FIELD

The present disclosure relates to the field of display product manufacturing technologies, in particular to an Electro-Static Discharge (ESD) protection circuit, a display panel and a display device.

BACKGROUND

Display devices have been widely used as display screens for consumption electronic products such as mobile phones, notebook computers, personal computers, and personal digital assistants. A display device generally includes an active matrix array substrate and a color filter substrate, or an upper substrate. During a manufacturing process of the array substrate, electrostatic accumulation is likely to occur due to processes such as plasma deposition, etching, and friction, or static electricity is generated during operation of the array substrate, resulting in electrostatic breakdown and electrostatic damage on the array substrate, and thus defects are caused.

ESD protection circuits are distributed around a panel and are an important part of the display device. The ESD protection circuits can ensure that the display device is protected from the electrostatic damage during production, transportation and operation. A Thin Film Transistor (TFT) in an ESD structure is generally designed with a long channel and a small width-to-length ratio of the channel to improve ESD-damage-prevention performance. However, a channel direction of the TFT is generally perpendicular to an extension direction of a data line or a gate line, a space for disposing the TFT is limited, and a length of the channel is limited, thus the ESD-damage-prevention performance is limited correspondingly.

SUMMARY

An ESD protection circuit, a display panel and a display device are provided in the present disclosure.

In order to achieve the above purpose, a technical solution adopted in the present disclosure is in that: an ESD protection circuit includes a TFT arranged between a to-be-protected signal line and a discharging line for providing the protection, a length direction of a channel of the TFT is parallel to an extension direction of the to-be-protected signal line.

Further, a width-to-length ratio of the channel of the TFT is less than 0.2.

Further, the to-be-protected signal line is a data line or a gate line.

Further, the TFTs include a first TFT and a second TFT, and the discharging lines include a first discharge line and a second discharge line; a drain electrode of the first TFT is electrically connected to the first discharge line, and a source electrode and a gate electrode of the first TFT are electrically connected to the to-be-protected signal line; and a drain electrode of the second TFT is electrically connected to the to-be-protected signal line, and a source electrode and a gate electrode of the second TFT are electrically connected to the second discharge line.

Further, the first discharge line and the second discharge line are short-circuited through a connection line.

Further, the first discharge line and the second discharge line intersect the to-be-protected signal line, and the first TFT and the second TFT are arranged between the first discharge line and the second discharge line.

Further, the to-be-protected signal lines are arranged side by side in a row direction or a column direction, and comprise a first to-be-protected signal line and a second to-be-protected signal line adjacent to each other, the first to-be-protected signal line is connected to the first discharge line and the second discharge line through an TFT, the second to-be-protected signal line is connected to a third discharge line and a fourth discharge line through another TFT, and the first discharge line, the second discharge line, the third discharge line and the fourth discharge lines are short-circuited through a connection line, the second discharge line and the third discharge line are a same line.

Further, the TFT connected to the first to-be-protected signal line and the TFT connected to the second to-be-protected signal line are arranged in a column along an extension direction of the to-be-protected signal line.

Further, the TFT includes a first TFT and a second TFT, and the discharging line includes a fifth discharge line. A gate electrode and a source electrode of the first TFT are electrically connected to the to-be-protected signal line, a drain electrode of the first TFT is electrically connected to a gate electrode and a source electrode of the second TFT, a drain electrode of the second TFT is electrically connected to the to-be-protected signal line, and the gate electrode of the second TFT is electrically connected to the fifth discharge line.

Further, to-be-protected signal lines are arranged side by side in a row direction or a column direction, and comprise a first to-be-protected signal line and a second to-be-protected signal line adjacent to each other, the TFT electrically connected to the first to-be-protected signal line and the TFT electrically connected to the second to-be-protected signal line are respectively arranged on two sides of the fifth discharge line.

Further, the TFT electrically connected to the first to-be-protected signal line and the TFT electrically connected to the second to-be-protected signal line are arranged in a column along an extension direction of the to-be-protected signal line.

Further, an active layer of the TFT is made of oxide semiconductor, amorphous silicon, or low temperature polysilicon.

Further, an insulation thin film is arranged on the channel of the TFT.

A display panel is provided in the present disclosure. The display panel includes the ESD protection circuit described above.

Further, the display panel further includes the to-be-protected signal line and the discharging line.

A display device is provided in the present disclosure. The display device includes the display panel described above.

DETAILED DESCRIPTION

In order to make an objective, a technical solution and an advantage of the embodiments of the present disclosure clearer, the technical solutions in the embodiments of the present disclosure will be described hereinafter clearly and completely with reference to the drawings of the embodiments of the present disclosure. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Generally, the less a width-to-length ratio of a channel of a TFT is, the better the ESD-damage-prevention performance is. However, in prior art, a channel direction of the TFT is perpendicular to an extension direction of a data line or a gate line, a space between two adjacent data lines or two adjacent gate lines is limited, a length of the channel of the TFT is limited, and thus the width-to-length ratio of the TFT is also limited. As a result, it is unable to improve the ESD-damage-prevention performance.

To solve the above problem, an ESD protection circuit is provided in the embodiments of the present disclosure. The ESD protection circuit includes a TFT 03 arranged between a to-be-protected signal line 01 and a discharging line 02 for providing protection, a length direction of the channel of the TFT 03 is parallel to an extension direction of the to-be-protected signal line 01. In one embodiment, the channel may be a thin semiconductor layer between a source electrode and a drain electrode of the TFT.

Figure 1:
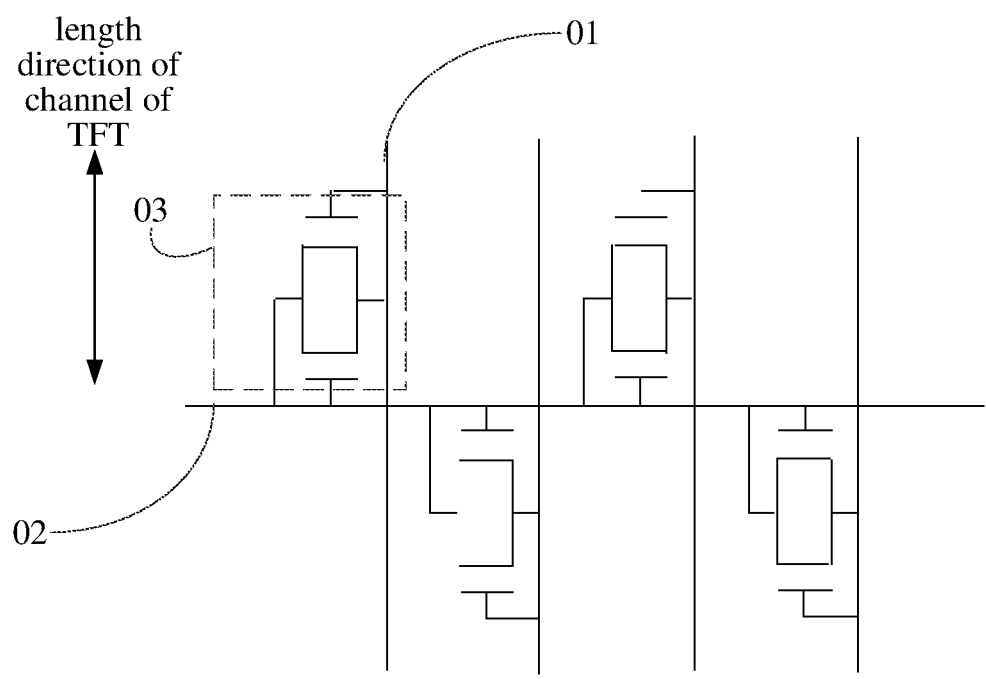
FIG. 1 is a schematic diagram of an ESD circuit in the present disclosure.
Figure 2:
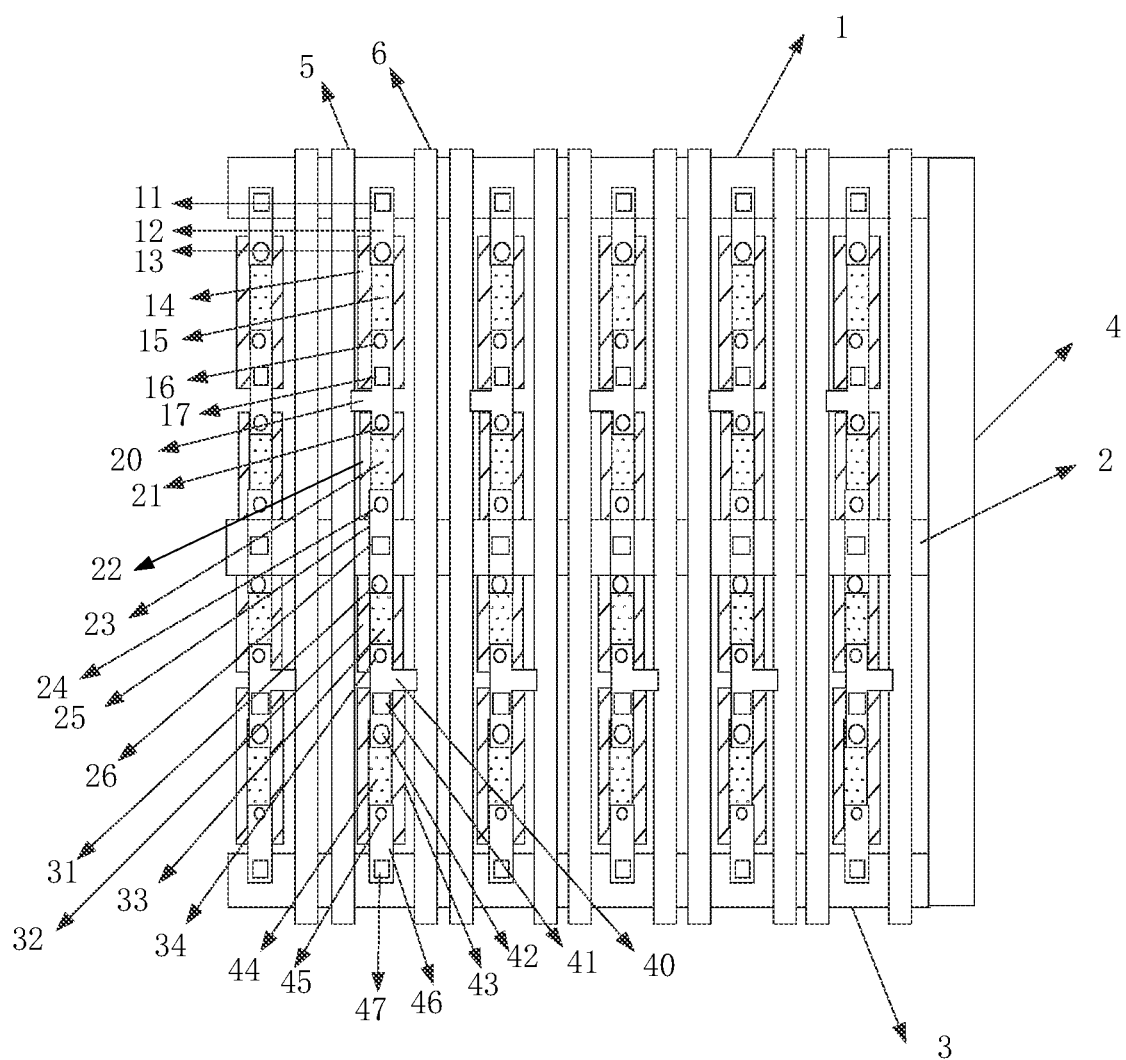
FIG. 2 is a schematic diagram of an ESD wiring structure according to some embodiments of the present disclosure.
Figure 3:
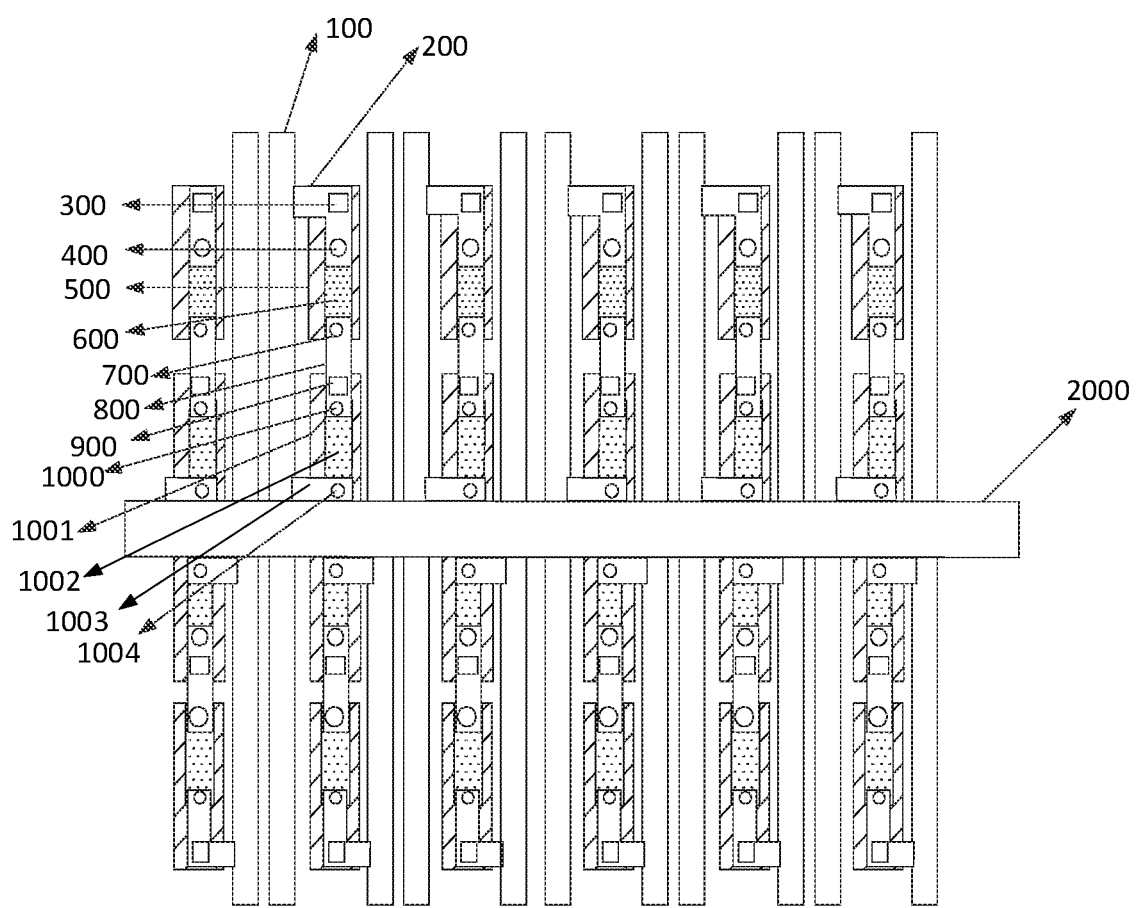
FIG. 3 is a schematic diagram of another ESD wiring structure according to some embodiments of the present disclosure.

FIG. 1 is a schematic diagram of an ESD circuit in the present disclosure, FIG. 2 and FIG. 3 are schematic diagrams of ESD wiring structures of the embodiments. The length direction of the channel of the TFT is parallel to the extension direction of the to-be-protected signal line, the width-to-length ratio of the channel of the TFT can be reduced by increasing the length of the channel of the TFT, thereby improving ESD-damage-prevention performance.

It should be appreciated that the ESD wiring structure is not limited to the wiring structures shown in FIGS. 2 and 3, as long as the length direction of the channel of the TFT of the ESD circuit is parallel to the extending direction of the to-be-protected signal line.

In this embodiment, a width-to-length ratio of the channel of the TFT is less than 0.2, which effectively improves the ESD-damage-prevention performance.

In this embodiment, the to-be-protected signal line is a data line or a gate line.

There can be various wiring structures of the ESD protection circuit. In this embodiment, the TFT includes a first TFT and a second TFT, and the discharging line includes a first discharge line and a second discharge line; a drain electrode of the first TFT is electrically connected to the first discharge line, and a source electrode and a gate electrode of the first TFT are electrically connected to the to-be-protected signal line; and a drain electrode of the second TFT is electrically connected to the to-be-protected signal line, and a source electrode and a gate electrode of the second TFT are electrically connected to the second discharge line.

In this embodiment, the first discharge line and the second discharge line are short-circuited through a connection line. It is ensured that voltages of the first discharge line and the second discharge line are same.

In this embodiment, the first discharge line and the second discharge line intersect the to-be-protected signal line, and the first TFT and the second TFT are arranged between the first discharge line and the second discharge line.

To facilitate a layout of the circuit, an extension direction of the first discharge line and an extension direction of the second discharge line are perpendicular to the extension direction of the to-be-protected signal line.

In this embodiment, the to-be-protected signal lines are arranged side by side, and comprise a first to-be-protected signal line and a second to-be-protected signal line adjacent to each other, the first to-be-protected signal line is connected to the first discharge line and the second discharge line through an TFT, the second to-be-protected signal line is connected to a third discharge line and a fourth discharge line through another TFT, and the first discharge line, the second discharge line, the third discharge line and the fourth discharge lines are short-circuited through a connection line, the second discharge line and the third discharge line are a same line.

Further, in this embodiment, the TFT connected to the first to-be-protected signal line and the TFT connected to the second to-be-protected signal line are arranged in a column along an extension direction of the to-be-protected signal line. Thus, spaces occupied by the TFTs in a direction perpendicular to the extension direction of the to-be-protected signal line are reduced.

In one embodiment, specifically, as shown in FIG. 2, a first discharge line 1, a second discharge line (i.e., a third discharge line) 2, a fourth discharge line 3, and a connection line (i.e., a short circuiting line 4) through which the first discharge line 1, the second discharge line (i.e., the third discharge line) 2 and the fourth discharge line 3 are short-circuited, are formed on a same layer with a gate electrode of the TFT. A first connection line 12, a second connection line 20, a third connection line 25, a fourth connection line 40, a fifth connection line 46 and to-be-protected signal lines (including a first to-be-protected signal line 5 and a second to-be-protected signal line 6) are formed on a same layer. A first TFT and a second TFT are arranged among the first discharge line 1, the second discharge line (i.e., the third discharge line) 2, and the first to-be-protected signal line 5, and a third TFT and a fourth TFT are arranged among the second discharge line (i.e., the third discharge line) 2, the fourth discharge line 3 and the second to-be-protected signal line 6, and the first to-be-protected signal line 5 and the second to-be-protected signal line 6 are arranged to be adjacent to each other. The second discharge line and the third discharge line are the same line.

A first end of the second connection line 20 is connected to the first to-be-protected signal line 5, one end of the first connection line 12 is connected to the first discharge line 1 through a first via hole 11, and the other end of the first connection line 12 is connected to a first active layer 15 through a second via hole 13 to form a drain electrode of the first TFT. A second end of the second connection line 20 is connected to the first active layer 15 through a third via hole 16 to form a source electrode of the first TFT, the second end of the second connection line 20 is connected to a first gate electrode 14 of the first TFT through a via hole 17. A third end of the second connection line 20 is connected to a second active layer 23 through a fifth via hole 21 to form a drain electrode of the second TFT. One end of the third connection line 25 is connected to the second active layer 23 through a sixth via hole 24 to form a source electrode of the second TFT, the other end of the third connection line 25 is connected to the second discharge line 2 through a seventh via hole 26. A gate electrode 22 of the second TFT is directly connected to the second discharge line (i.e., the third discharge line) 2. An ESD circuit of the first to-be-protected signal line 5 includes the first TFT and the second TFT.

A first end of the fourth connection line 40 is connected to the second to-be-protected signal line 6, and the third connection line 25 is connected to a third active layer 33 through an eighth via hole 31 to form a source electrode of the third TFT. A second end of the fourth connection line 40 is connected to the third active layer 33 through a ninth via hole 34 to form a drain electrode of the third TFT. A third gate electrode 32 of the third TFT is directly connected to the second discharge line (i.e., the third discharge line) 2. A third end of the fourth connection line 40 is connected to a third gate electrode 43 of the fourth TFT through a tenth via hole 41, and the third end of the fourth connection line 40 is connected to a fourth active layer 44 through an eleventh via hole 42 to form a source electrode of the fourth TFT. The fifth connection line 46 is connected to the fourth active layer 44 through a twelfth via hole 45 to form a drain electrode of the fourth TFT, and the fifth connection line 46 is connected to the fourth discharge line 3 through a thirteenth via hole 47. An ESD circuit of the second to-be-protected signal line 6 includes the third TFT and the fourth TFT.

In another embodiment, as shown in FIG. 3, the TFT includes a first TFT and a second TFT, and the discharging line includes a fifth discharge line.

A gate electrode and a source electrode of the first TFT are electrically connected to the to-be-protected signal line, a drain electrode of the first TFT is electrically connected to a gate electrode and a source electrode of the second TFT, a drain electrode of the second TFT is electrically connected to the to-be-protected signal line, and the gate electrode of the second TFT is electrically connected to the fifth discharge line.

In this embodiment, to-be-protected signal lines arranged side by side includes a first to-be-protected signal line and a second to-be-protected signal line adjacent to each other, the TFT electrically connected to the first to-be-protected signal line and the TFT electrically connected to the second to-be-protected signal line are respectively arranged on two sides of the fifth discharge line.

Further, in this embodiment, the TFT connected to the first to-be-protected signal line and the TFT connected to the second to-be-protected signal line are arranged in a column along an extension direction of the to-be-protected signal line. Thus, the spaces occupied by the TFTs in the direction perpendicular to the extension direction of the to-be-protected signal line are reduced.

As shown in FIG. 3, one end of a sixth connection line 200 is connected to a third to-be-protected signal line 100, the other end of the sixth connection line 200 is connected to a gate electrode 500 of a fifth TFT through a fourteenth via hole 300, and the other end of the sixth connection line 200 is connected to an active layer 600 of the fifth TFT through a fifteenth via hole 400 to form a source electrode of the fifth TFT. One end of a seventh connection line 800 is connected to the active layer 600 of the fifth TFT through a sixteenth via hole 700 to form a drain electrode of the fifth TFT, the other end of the seventh connection line 800 is connected to a gate electrode 1001 of a sixth TFT through a seventeenth via hole 900, and the other end of the seventh connection line 800 is connected to an active layer 1002 of the sixth TFT through an eighteenth via hole 1000 to form a source electrode of the sixth TFT. One end of an eighth connection line 1003 is connected to the third to-be-protected signal line 100, and the other end of the eighth connection line 1003 is connected to the active layer 1002 of the sixth TFT through a nineteenth via hole 1004 to form a drain electrode of the sixth TFT. The gate electrode 1001 of the sixth TFT is connected to a fifth discharge line 2000.

In this embodiment, an active layer of the TFT is made of oxide semiconductor. Alternatively, the active layer of the TFT may be made of other semiconductor material, such as amorphous silicon, or low temperature polysilicon.

Figure 6:
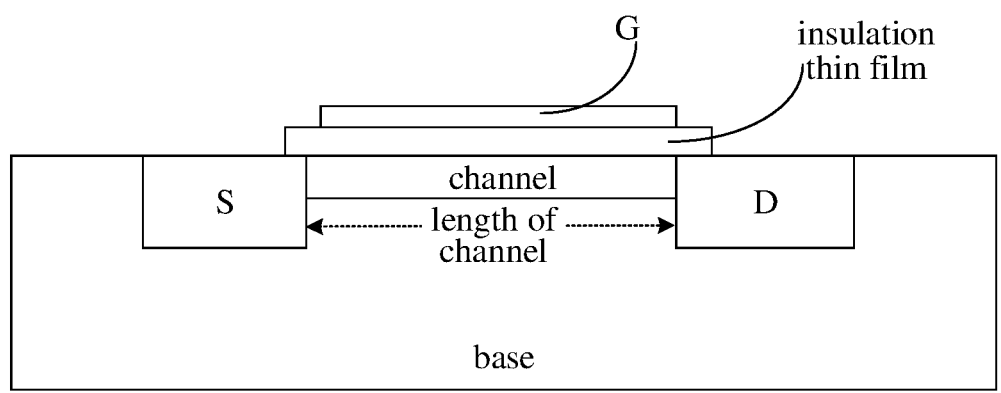
FIG. 6 is a schematic sectional diagram of a TFT according to some embodiments of the present disclosure.

In this embodiment, an insulation thin film is arranged on a gap between a source electrode and a drain electrode corresponding to the active layer of the TFT. For example, as shown in FIG. 6, the TFT includes a source electrode S, a drain electrode D and a gate electrode G. An insulation thin film is arranged on the channel of the TFT, and the insulation thin film can be used as an etch-stop layer or a channel protection layer.

It should be appreciated that a connection relationship between the source electrode and the drain electrode, arranging positions, and the like in the above embodiments are all interchangeable and can be set according to practical applications.

Figure 4:
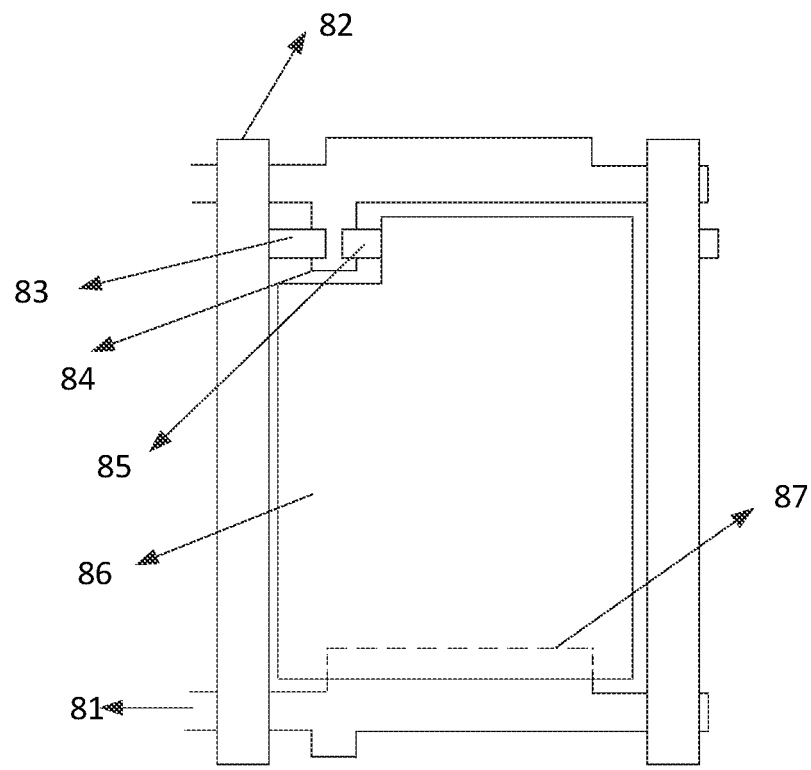
FIG. 4 is a schematic structural diagram of a first TFT according to some embodiments of the present disclosure.

In the following, a TFT with a bottom-gate structure is taken as an example to introduce a structure and a manufacturing process of the TFT in this embodiment, as shown in FIG. 4.

A gate metal thin film is formed on a transparent substrate, a gate pattern is formed in an etching process through a photolithography process by using a mask, and the gate pattern includes a gate line 81, a gate electrode 84 and a gate protruding portion 87 forming a storage capacitor.

A gate insulation thin film, a semiconductor layer (including an intrinsic semiconductor thin film and a doped semiconductor thin film) and a source-drain metal thin film are formed sequentially and continuously. A step-shaped photoresist pattern is defined by using a gray tone mask, and photoresist on the TFT channel (gray tone photoresist being partially reserved) is thinner than photoresist on a source electrode, a drain electrode and a data line (full tone photoresist being fully reserved). A source electrode 83, a drain electrode 85, and a data line 82 are formed through an etching process. After completely removing photoresist in a photoresist partially-reserved region (a region corresponding to the gray tone mask), the source-drain metal thin film and the doped semiconductor thin film are continuously etched to form a TFT conductive channel.

A passivation protection film is formed, and a pattern of the passivation protection film is defined by using a mask.

A transparent conductive thin film is formed on the passivation protection film, and a pixel electrode 86 is formed by using a mask.

In the above manufacturing steps, the gate metal thin film and the source-drain metal thin film are manufactured by using a same or similar method, such as magnetron sputtering, evaporation, etc., and are made of similar low-resistance metal materials, such as molybdenum, aluminum, aluminum-nickel alloy, chromium or copper. The gate metal thin film can be a single-layered metal thin film such as Al, Cu, Mo, Ti, or AlNd, or may be a multi-layered metal thin film such as Mo/Al/Mo or Ti/Al/Ti. The gate insulation thin film, the intrinsic semiconductor thin film, and the doped semiconductor thin film can be continuously formed on a same device by using a same method. The gate insulation thin film is usually made of silicon oxide, silicon nitride, silicon oxynitride, etc., while the intrinsic semiconductor layer and doped semiconductor thin film are made of amorphous silicon, microcrystalline silicon, polysilicon, etc.

In the above etching process, different etching methods, etching liquids and etching gases are required to realize selection ratios of different materials, slope angles, and control of Critical Dimensions (CDs). For example, in the process of forming the data line 82, the source electrode 83, and the drain electrode 85, a gate insulation dielectric layer, the intrinsic semiconductor thin film, and the doped semiconductor thin film can be removed by using a similar method, i.e., plasma etching or reactive ion etching. By adjusting etching gases and etching conditions, the three layered thin film can be etched in the same device. For example, different etching gases combinations and different gas flow capabilities may be selected from gases such as sulfur hexafluoride, chlorine gas, oxygen gas, helium gas, etc., such that the etching of the above different thin films may be implemented in the same device. For example, sulfur hexafluoride, chlorine gas and helium gas can be used for etching a semiconductor thin film; sulfur hexafluoride, oxygen gas and helium gas can be used for etching an insulation thin film; chlorine gas and oxygen gas can be used for etching a metal thin film. In order to achieve an optimization of a device structure and a high efficiency of the process, etching conditions of different films, such as plasma power, air pressure, and electrode spacing, are different. The etching of the semiconductor thin film is generally performed in a plasma chamber having a low pressure and a high power, which has a strong effect of ion bombardment and sputtering etching. The insulation thin film and the metal thin film are generally processed in a plasma chamber having a high air pressure and a slightly low power, which has a strong chemical reaction ion etching effect. For example, tens of sccm of sulfur hexafluoride and thousands of sccm of chlorine gas are input into a device, the semiconductor thin film can be efficiently etched and removed under a power above several kilowatts and tens of millitorr of air pressure. Hundreds of sccm of sulfur fluoride and hundreds of sccm of chlorine gas are input into the device, the insulation thin film can be efficiently etched and removed under a power below several kilowatts and hundreds of millitorr of air pressure. For another example, in the process of forming the data line 82, the source electrode 83, and the drain electrode 85, according to source-drain metal material, the source-drain metal thin film can be removed by using an etching method with chemical etching solution, and a plasma etching method or a reactive ion etching method can alternatively be used. For example, hundreds to thousands of sccm of chlorine gas and thousands of sccm of oxygen gas are input into a dry etching device, the metal thin film can be efficiently etched and removed under a power below several kilowatts and hundreds of millitorr of air pressure. When forming the gate line 81, the gate line protruding portion 87, insulation medium of the storage capacitor, and the TFT channel, by using the plasma etching method or the reactive ion etching method and the conditions described above, the source-drain metal thin film and the doped semiconductor layer are continuously etched and removed in the same device. Wet etching is only used for the removal of the metal thin film, which is generally implemented by immersing into and spraying, at a temperature of tens of degrees, a mixed solution of nitric acid, hydrochloric acid and acetic acid in a certain concentration ratio.

Figure 5:
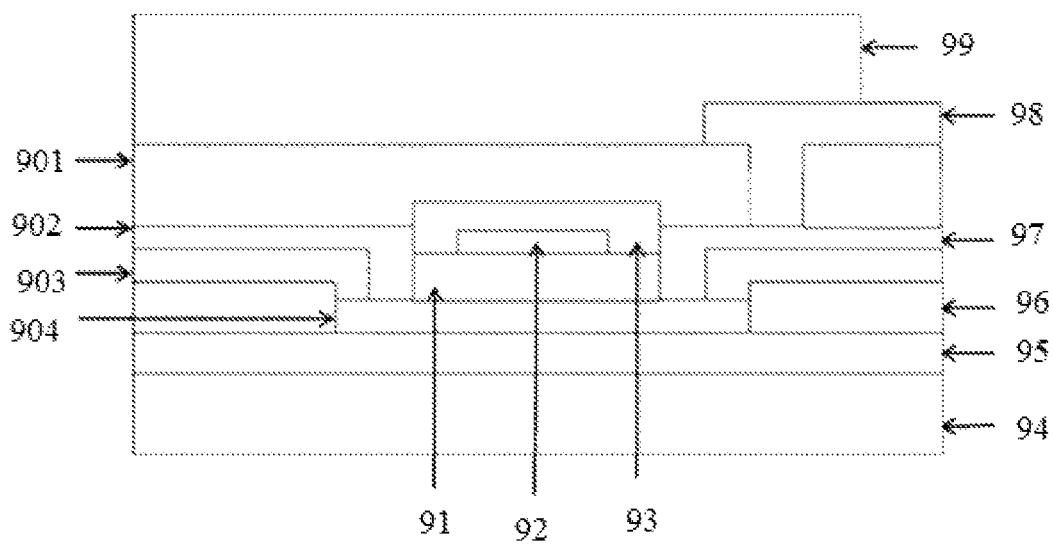
FIG. 5 is another schematic structural diagram of a first TFT according to some embodiments of the present disclosure.

A structure and a manufacturing process of a TFT with a top-gate structure are described below, as shown in FIG. 5.

By using a Plasma Enhanced Chemical Vapor Deposition (PECVD) process, a silicon nitride (SiN) thin film and a silicon dioxide (SiO2) thin film are sequentially deposited on an entire insulation substrate 94 to form a buffer layer 95 composed of silicon nitride and silicon dioxide. And an amorphous silicon (a-Si) thin film is formed on the buffer layer 95 by using PECVD or other chemical or physical vapor deposition methods. By using an Excimer Laser Annealing (ELA) or Solid Phase Crystallization (SPC) process, a-Si is crystallized into a polysilicon thin film. And then, a pattern of a photoresist layer is formed on the polysilicon thin film by using a mask process in the related art. The photoresist layer is used as an etch-stop layer, and a part of the polysilicon thin film not protected by the photoresist layer is etched by plasma to form a polysilicon active layer 904 and a polysilicon storage capacitor. Low-concentration ion doping process is performed on a transistor channel in the polysilicon active layer 904 by using an ion implantation process to form a conductive channel required by the TFT in the polysilicon active layer 904.

Photoresist composed of photoresist material is formed on the polysilicon active layer 904 by using a mask process to protect the polysilicon active layer 904 from ion implantation. A high-concentration ion implantation process is performed on the polysilicon storage capacitor without the protection of the photoresist layer to convert the polysilicon storage capacitor into a low-resistance doped polysilicon thin film.

Photoresist on the polysilicon active layer 904 is removed through a photoresist removing process, a SiO2 thin film or a composite thin film of SiO2 and SiN is deposited by using a PECVD process, and a gate insulation layer 96 is formed on the polysilicon storage capacitor, the polysilicon active layer 904 and the entire buffer layer 95. One or more low-resistance metal material thin films are deposited on the gate insulation layer 96 by using a physical vapor deposition method such as magnetron sputtering, and a gate electrode 92 is formed by using a photolithography process. The gate metal thin film can be a single-layered metal thin film such as Al, Cu, Mo, Ti, or AlNd, or may be a multi-layered metal thin film such as Mo/Al/Mo or Ti/Al/Ti. The gate electrode 92 is used as an ion implantation barrier layer, ion doping process is performed on the polysilicon active layer 904, and a low-impedance source electrode and drain electrode contact region is formed in a region of the polysilicon active layer which is not blocked by the gate electrode.

A SiO2 thin film and a SiN thin film are sequentially deposited on an entire surface including the gate electrode 92 by using a PECVD process to form an interlayer insulation layer 93, and the interlayer insulating layer 93 is etched through a mask and an etching process to form a source electrode and drain electrode contact hole. One or more low-resistance metal thin films is deposited on an interlayer insulating layer 8 and the source electrode and drain electrode contact hole by using a magnetron sputtering process, a source electrode 902 and a drain electrode 97 is formed through a mask and an etching process, and the source electrode 902 and the drain electrode 97 are enabled to be in an ohmic contact with the polysilicon active layer 904 through the contact hole. The ions doped in the polysilicon active layer 904 are activated by using a rapid thermal annealing or a thermal furnace annealing, and an effective conductive channel is formed in the polysilicon active layer 904 below the gate electrode 92. The source-drain metal thin film can be a single-layered metal thin film such as Al, Cu, Mo, Ti, or AlNd, or a multi-layered metal thin film such as Mo/Al/Mo or Ti/Al/Ti.

A SiN thin film is deposited on an entire surface including the source electrode 902 and the drain electrode 97 by using a PECVD process, and a passivation layer 901 including a via hole is formed through a mask and an etching process. A hydrogenation process is performed by using the rapid thermal annealing process or the thermal furnace annealing process to repair defects inside the polysilicon active layer 904 and defects on surfaces of the polysilicon active layer 904. By using the mask process again, an organic planarization layer having a same via hole as the via hole is formed on the SiN passivation layer 901, and dents on a surface of the device are filled to form a flat surface.

A transparent conductive thin film is deposited on the organic planarization layer and the via hole by using a magnetron sputtering process, and the transparent conductive thin film is etched through the photolithography process to form a pixel electrode 98 of a pixel region on the via hole and a part of the organic planarization layer. Then, a layer of photosensitive organic material similar to the organic planarization layer is coated on the organic planarization layer and the pixel electrode 98, and partial area of the pixel electrode 98 is exposed through a last mask process to form a pixel definition layer 99 shown in FIG. 5. The pixel definition layer 99 covers the organic planarization layer and partial area of the pixel electrode 98. The transparent conductive thin film can be a single-layered oxide conductive thin film, such as Indium Tin Oxide (ITO) or Indium Zinc Oxide (IZO), or can be a composite film such as ITO/Ag/ITO, or IZO/Ag.

In conclusion, at least 8 to 9 photolithography processes are required to form the low-temperature polysilicon thin film field effect transistor array substrate shown in FIG. 5, including the formation of the polysilicon active layer, storage capacitor doping, the gate electrode, the interlayer insulation layer contact hole, the source electrode, the drain electrode, the passivation layer via hole, the planarization layer and the pixel electrode by using the photolithography processes.

A display panel is provided in the present disclosure. The display panel includes the ESD protection circuit described above.

Further, the display panel further includes the to-be-protected signal line and the discharging line.

A display device is provided in the present disclosure. The display device includes the display panel described above.

The above are merely preferred embodiments of the present disclosure. It should be appreciated that a person skilled in the art may make further modifications and improvements without departing from the principle of the present disclosure, and these modifications and improvements shall also fall within the scope of the present disclosure.

What is claimed is:

1. An Electro-Static Discharge (ESD) protection circuit, comprising at least one Thin Film Transistor (TFT) arranged between at least one to-be-protected signal line and a discharging line, wherein a length direction of a channel of each of the at least one TFT is parallel to an extension direction of the at least one to-be-protected signal line, wherein a width-to-length ratio of the channel of the at least one TFT is less than 0.2;
   wherein the at least one TFT comprises a first TFT and a second TFT, and the discharging line comprises a fifth discharge line,
   a gate electrode and a source electrode of the first TFT are electrically connected to the at least one to-be-protected signal line, a drain electrode of the first TFT is electrically connected to a gate electrode and a source electrode of the second TFT, a drain electrode of the second TFT is electrically connected to the at least one to-be-protected signal line, and the gate electrode of the second TFT is electrically connected to the fifth discharge line.

2. The ESD protection circuit according to claim 1, wherein the at least one to-be-protected signal line comprises a data line or a gate line.

3. The ESD protection circuit according to claim 1, wherein the at least one to-be-protected signal line comprises a first to-be-protected signal line and a second to-be-protected signal line that are arranged side by side in a row direction or a column direction, a the first to-be-protected signal line and the second to-be-protected signal line being adjacent to each other, the first TFT is electrically connected to the first to-be-protected signal line and the second TFT is electrically connected to the second to-be-protected signal line, and the first TFT and the second TFT are respectively arranged on two sides of the fifth discharge line.

4. The ESD protection circuit according to claim 3, wherein the first TFT connected to the first to-be-protected signal line and the second TFT connected to the second to-be-protected signal line are arranged in a column along the extension direction of the at least one to-be-protected signal line.

5. The ESD protection circuit according to claim 1, wherein an active layer of the at least one TFT is made of oxide semiconductor, amorphous silicon, or low temperature polysilicon.

6. The ESD protection circuit according to claim 1, wherein an insulation thin film is arranged on the channel of the at least one TFT.

7. A display panel, comprising an Electro-Static Discharge (ESD) protection circuit, wherein the ESD protection circuit comprises:
   at least one Thin Film Transistor (TFT) arranged between at least one to-be-protected signal line and a discharging line, wherein a length direction of a channel of each of the at least one TFT is parallel to an extension direction of the at least one to-be-protected signal line, wherein a width-to-length ratio of the channel of the at least one TFT is less than 0.2;
   wherein the at least one TFT comprises a first TFT and a second TFT, and the discharging line comprises a fifth discharge line,
   a gate electrode and a source electrode of the first TFT are electrically connected to the at least one to-be-protected signal line, a drain electrode of the first TFT is electrically connected to a gate electrode and a source electrode of the second TFT, a drain electrode of the second TFT is electrically connected to the at least one to-be-protected signal line, and the gate electrode of the second TFT is electrically connected to the fifth discharge line.

8. The display panel according to claim 7, wherein the at least one to-be-protected signal line comprises a data line or a gate line.

9. A display device, comprising a display panel, wherein the display panel comprises an Electro-Static Discharge (ESD) protection circuit, wherein the ESD protection circuit comprises:

at least one Thin Film Transistor (TFT) arranged between at least one to-be-protected signal line and a discharging line, wherein a length direction of a channel of each of the at least one TFT is parallel to an extension direction of the at least one to-be-protected signal line, wherein a width-to-length ratio of the channel of the at least one TFT is less than 0.2;

wherein the at least one TFT comprises a first TFT and a second TFT, and the discharging line comprises a fifth discharge line, a gate electrode and a source electrode of the first TFT are electrically connected to the at least one to-be-protected signal line, a drain electrode of the first TFT is electrically connected to a gate electrode and a source electrode of the second TFT, a drain electrode of the second TFT is electrically connected to the at least one to-be-protected signal line, and the gate electrode of the second TFT is electrically connected to the fifth discharge line.

\* \* \* \* \*